US005739481A

United States Patent [19]

Baumhauer, Jr. et al.

[11] Patent Number: 5,739,481

[45] Date of Patent: Apr. 14, 1998

[54] SPEAKER MOUNTING SYSTEM

[75] Inventors: John C. Baumhauer, Jr.; Chen-Chieh Lin, both of Indianapolis; Raymond Motluck; Christopher T. Welsh, both of Noblesville, all of Ind.

[73] Assignee: Lucent Technologies Inc., Murray Hill, N.J.

[21] Appl. No.: 649,096

[22] Filed: May 17, 1996

[51] Int. Cl.[6] .............................. H05K 5/00; G10K 13/00

[52] U.S. Cl. .......................... 181/148; 181/150; 181/172; 181/199

[58] Field of Search ..................................... 181/148, 156, 181/165, 166, 171, 172, 199, 150

[56] References Cited

U.S. PATENT DOCUMENTS

| | | | |
|---|---|---|---|
| 2,439,666 | 4/1948 | Marquis | 181/172 |
| 2,840,177 | 6/1958 | Schoengold | 181/172 |
| 3,684,052 | 8/1972 | Sotome | 181/171 |
| 3,892,289 | 7/1975 | Rollins | 181/171 |
| 5,455,396 | 10/1995 | Willard et al. | 181/172 |

*Primary Examiner*—Eddie C. Lee

[57] ABSTRACT

A speaker mounting system wherein the speaker is mounted to a support surface indirectly by a compliant gasket with no rigid mechanical coupling between the speaker and the surface. Accordingly, mechanical transmission of vibrations from the speaker to the surface is greatly reduced. The gasket has a cross-section configured as a curved beam with one end secured to the support surface and the other end terminated by a thickened portion having an interior annular groove receiving the open end edge of the rigid outer basket of the speaker.

15 Claims, 5 Drawing Sheets

SPEAKER MOUNTING SYSTEM

BACKGROUND OF THE INVENTION

This invention relates to a mounting system for an audio speaker and, more particularly, to such a mounting system wherein speaker vibrations are isolated from the surface to which the speaker is mounted.

In present day speakerphone telephone sets and telephone answering machines, an audio speaker is typically mounted to an interior surface of the housing immediately adjacent an array of sound port openings. The speaker conventionally comprises a frusto-conical rigid outer basket, usually made of metal, an inner vibratory paper cone and a speaker magnet assembly. For mounting, the outer basket is usually clamped to the interior housing surface either directly or through a flat compression gasket. This conventional mounting technique results in a rigid mechanical coupling between the speaker and the housing which transmits vibrations from the speaker to the housing. These transmitted vibrations cause the housing to vibrate and radiate its own sound, which interferes with the sound radiated directly from the speaker, and degrades the overall sound. In addition, these transmitted vibrations reach other parts of the product, such as telephone buttons, which results in vibration of these parts and a buzz or rattle predominantly in the 300 to 400 Hz range, creating an annoying noise to the user. It is therefore an object of the present invention to eliminate this vibration transmission as much as possible.

If a simple compression gasket were to be utilized on both sides of the basket, calculations conclude that to reduce the vibrations, the gasket material would have to have a modulus of elasticity which would be about an order of magnitude less than is presently practical. It is therefore another object of this invention to provide a mounting system of the type described which utilizes practical materials.

Another problem with clamping the speaker to the housing is that if the housing surface and the clamping mechanism are not closely matched, the speaker basket may become distorted, which can result in rubbing of the voice coil and the production of distorted sound. It is therefore a further object of this invention to provide a mounting system which is tolerant of housing surface deviations.

SUMMARY OF THE INVENTION

The foregoing and additional objects are attained in accordance with the principles of this invention by providing a speaker mounting system for mounting a speaker to a support surface, wherein the speaker includes a rigid outer basket which tapers inwardly from an open end toward a speaker magnet. The mounting system comprises a compliant mounting member secured to the outer basket at its open end and holding means for clamping the compliant mounting member to the support surface. The holding means is arranged to not restrict movement of the outer basket so that the speaker is held only by the compliant mounting member.

In accordance with an aspect of this invention, the outer basket is frusto-conical in shape and the compliant mounting member includes an annular member surrounding the open end of the outer basket. The annular member has an annular interior groove adapted to surround and receive the open end edge of the outer basket. The circumference of the annular mounting member is sized relative to the circumference of the outer basket open end edge so that the elasticity of the annular mounting member maintains the outer basket open end edge within the interior groove.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
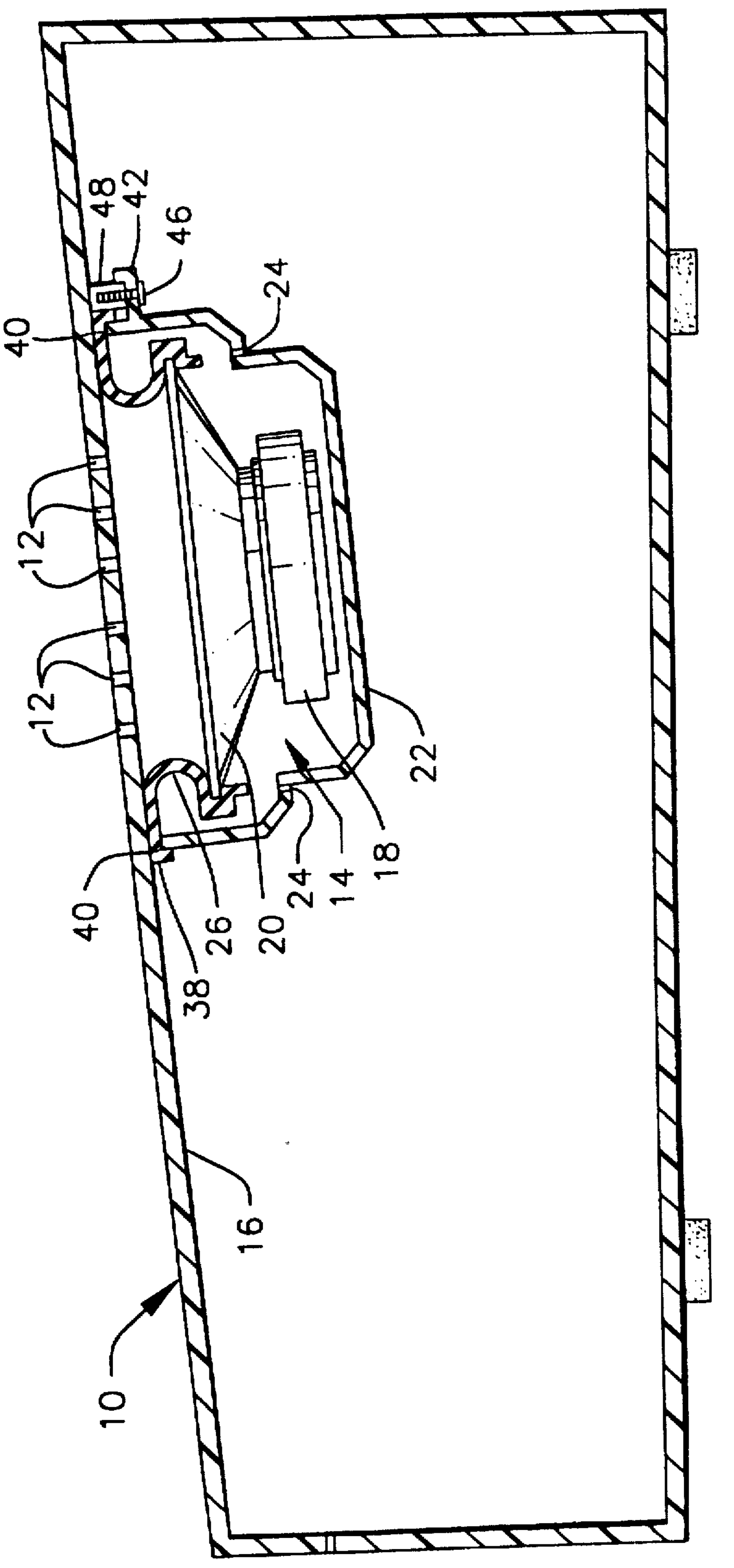
FIG. 1 is a partially sectioned side view showing the interior of a housing with a speaker mounted therein by a mounting system constructed in accordance with the principles of this invention.

Referring now to the drawings, FIG. 1 shows a two-part housing 10 which may be utilized for a speakerphone telephone set, a telephone answering machine, and the like. It is understood that the present invention also finds utility in a multi-media personal computer, audio equipment or a television, for example, in addition to telephone related equipment. The housing 10 includes an array of sound port openings 12. An audio speaker 14 is mounted to the interior surface 16 of the housing 10 adjacent the openings 12. As is conventional, the speaker 14 includes a speaker magnet assembly 18, a rigid outer basket 20 which is typically made of metal and is frusto-conical in shape, and an inner vibratory paper or plastic cone (not shown). As shown, the speaker 14 is contained within an enclosure 22 having one or more spaced openings, or vents, 24 for reducing the acoustic back pressure produced by speaker vibrations.

Figure 2:
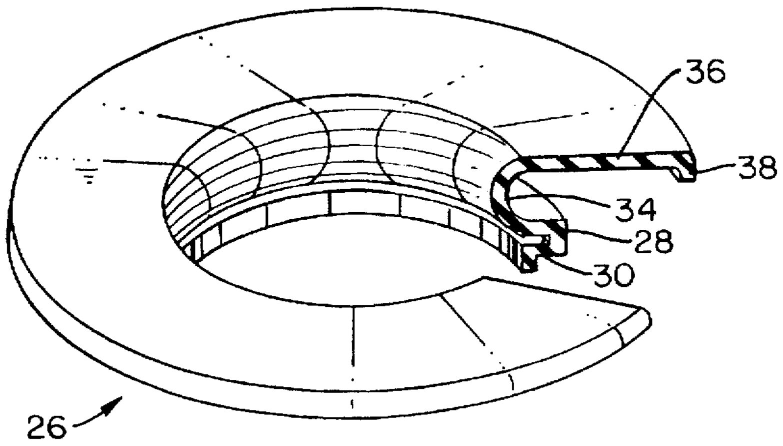
FIG. 2 is a partially cut away perspective view of a compliant mounting member constructed in accordance with the principles of this invention.
Figure 3:
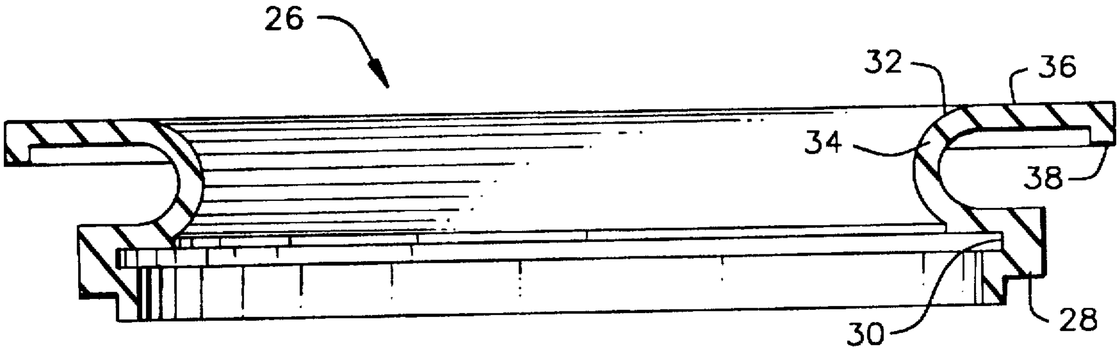
FIG. 3 is a cross sectional view of the mounting member of FIG. 2.
Figure 4:
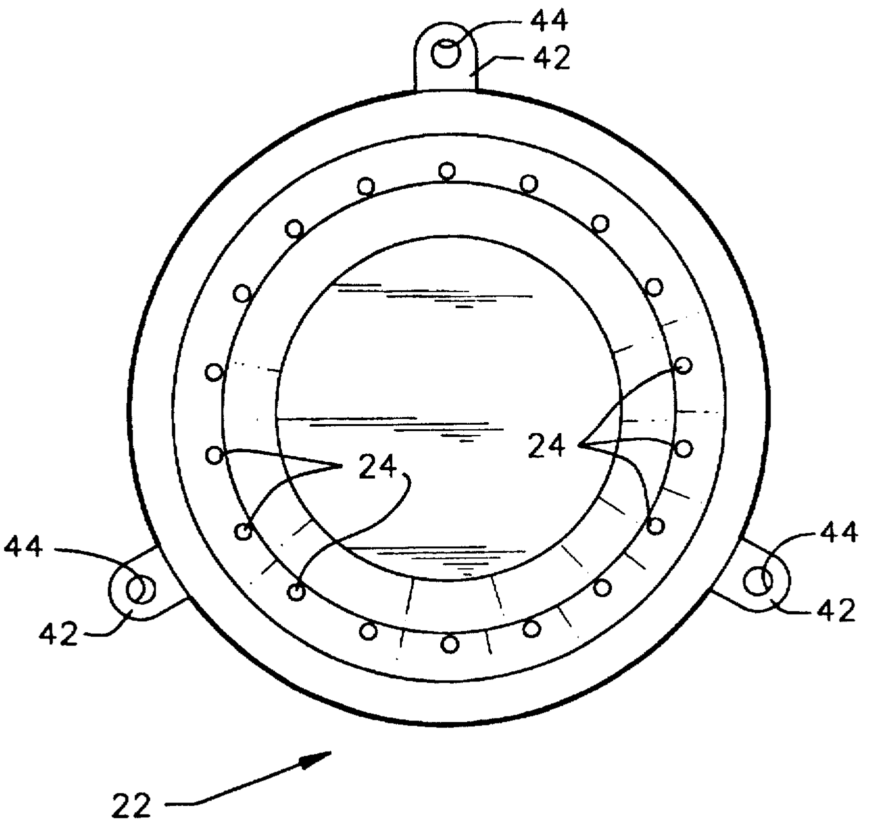
FIG. 4 is a top view of an illustrative holding means and speaker enclosure.

In accordance with this invention, a compliant mounting member 26 is provided. As shown in FIGS. 2 and 3, the mounting member 26 is a compliant annular gasket, illustratively molded of SANTOPRENE® 111-45 material, which has a modulus of elasticity (E) equal to $10.5\times10^6$ $N/m^2$. The gasket 26 is formed with a thickened annular portion 28 having an annular interior groove 30. Extending from one side of the thickened portion 28 is a relatively thin annular extension 32. In cross section, the extension 32 has a generally C-shaped, curved, beam-like, portion 34 adjacent the thickened portion 28 and a flat distal portion 36 terminated by a flange 38 directed back toward the thickened portion 28. The open end edge of the basket 20 fits within the groove 30 and the circumference of the thickened portion 28 of the gasket 26 is sized slightly smaller than the circumference of the open end edge of the outer basket 20 so that the elasticity of the gasket 26 maintains the open end edge of the outer basket 20 within the groove 30.

The enclosure 22 functions to hold the speaker 14 by clamping the gasket 26 to the interior surface 16, without contacting the speaker 14, thereby avoiding any rigid coupling between the speaker 14 and the housing 10. As shown, the enclosure 22 is cup-shaped, but its functionality for the present invention can be effected by an open annular clamping ring, as will be apparent from the following discussion. Thus, the enclosure 22 is generally circular to match the shape of the gasket 26 and has a circular edge 40 adapted to bear against the flat portion 36 of the gasket 26. The edge 40 is sized to fit within the circumference of the flange 38. The flange 38 helps to locate the enclosure 22 concentric with the gasket 26.

The enclosure 22 is further formed with a plurality of outwardly extending tabs 42, preferably at least three in number, spaced around the periphery of the enclosure 22, and extending outwardly beyond the periphery of the gasket 26. The tabs 42 are used for securing the enclosure 22 to the interior surface 16. Toward this end, each of the tabs 42 is formed with a central aperture 44 for accepting a screw 46 therethrough. The interior surface 16 is formed with a plurality of counterbored bosses 48 which are located so as to each be in registry with a respective one of the tabs 42. Accordingly, as shown in FIG. 1, the screws 46 extend through the apertures 44 in the tabs 42 and are then threadedly engaged in the counterbored apertures of the bosses 48 so that the flat portion 36 of the gasket 26 is clamped to the interior surface 16 of the enclosure 10. Thus, the enclosure 22 does not restrict movement of the speaker 14 since it is not in contact therewith and the speaker 14 is held only by the gasket 26. Therefore, vibrations of the speaker 14 are not mechanically transmitted to the housing 10.

Figure 5:
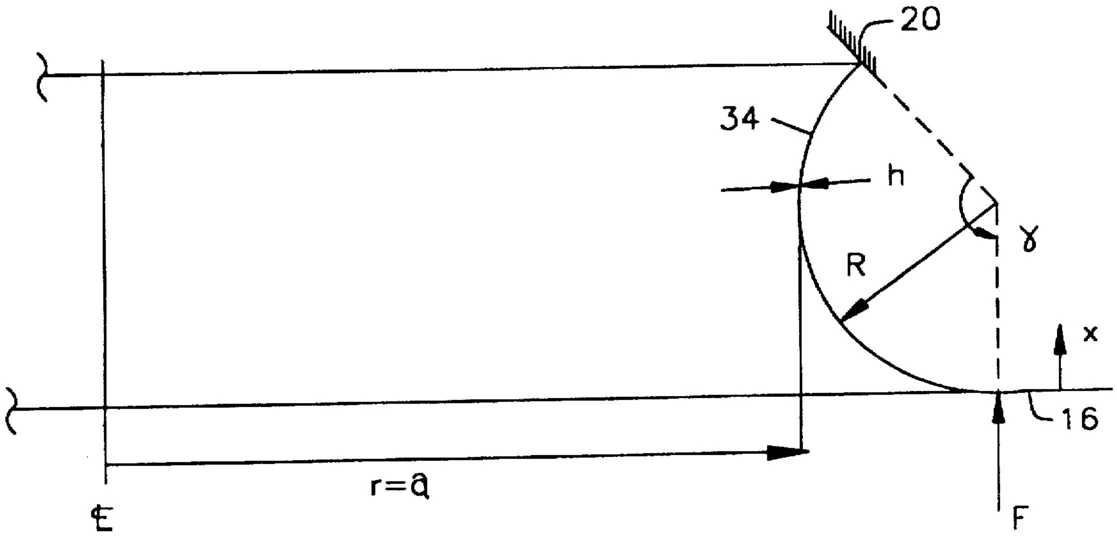
FIG. 5 is a drawing useful for understanding the principles of this invention.

To reduce the transmission of speaker vibrations, it is desirable to achieve as high a mechanical compliance as possible for the mounting structure, and the aforedescribed mounting arrangement utilizing an annular gasket having a cross-section configured as a curved beam results in much greater (between one and two orders of magnitude) mechanical compliance than using a simple compression gasket. With reference to FIG. 5, which schematically shows the C-shaped portion 34 of the gasket 26 coupled between the speaker outer basket 20 and the interior surface 16, the mechanical compliance C may be calculated as follows:

$$C = x/F = \frac{R^3 G(1 - \nu^2)12}{Eh^3(2\pi(a + R/2))}$$

$$\text{where } G = \left( \frac{\nu}{2} - \frac{\sin 2\nu}{4} \right);$$

E=modulus of elasticity; and v=Poisson's ratio.

In an illustrative example, $\gamma=137°$, $1-v^2 \cong 0.94$, and $a=26\times 10^{-3}$m.

Therefore, $C \cong \delta R^3/Eh^3$, where $\delta=99\ m^{-1}$.

In this illustrative embodiment $R=2.4\times 10^{-3}$m, $h=1.2\times 10^{-3}$m, and $E=10.5\times 10^6 N/m^2$.

Therefore, $C=7.5\times 10^{-5}$ m/N.

Figure 6:
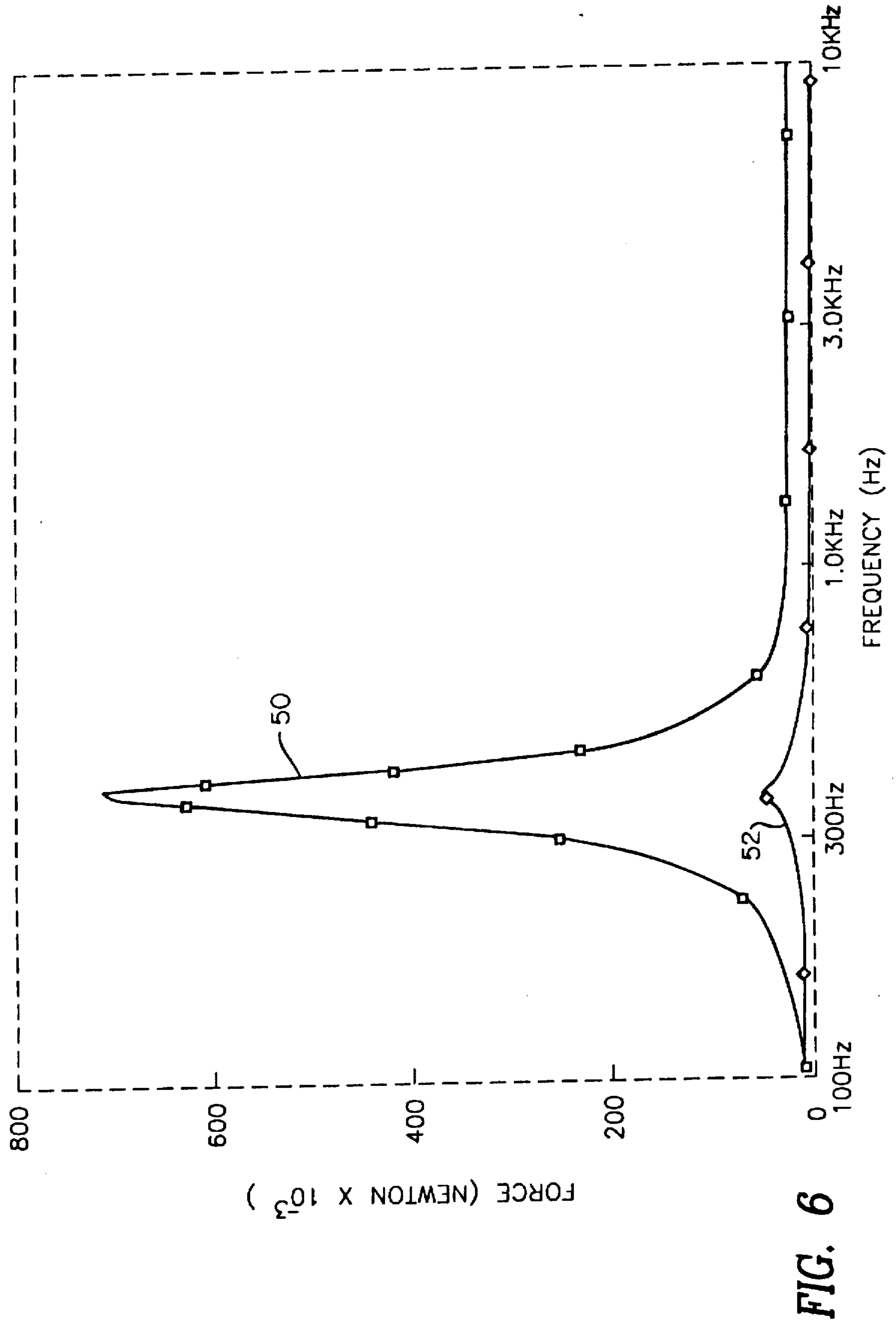
FIG. 6 is a pair of computer simulation generated curves showing the force transmitted to the housing from the speaker, as a function of frequency, for a first case where the speaker is clamped directly to the housing surface and for a second case where the speaker is mounted by the inventive system as shown in FIG. 1.

FIG. 6 illustrates a pair of computer simulation generated curves showing the force transmitted to the housing 10 as a function of frequency. The curve 50 is for the case where the outer basket 20 is clamped directly to the housing 10 and the curve 52 is for the case where the speaker 14 is mounted to the housing 10 by the arrangement shown in FIGS. 1–4 and described above. The improved reduction in force transmission is dramatic.

Figure 7:
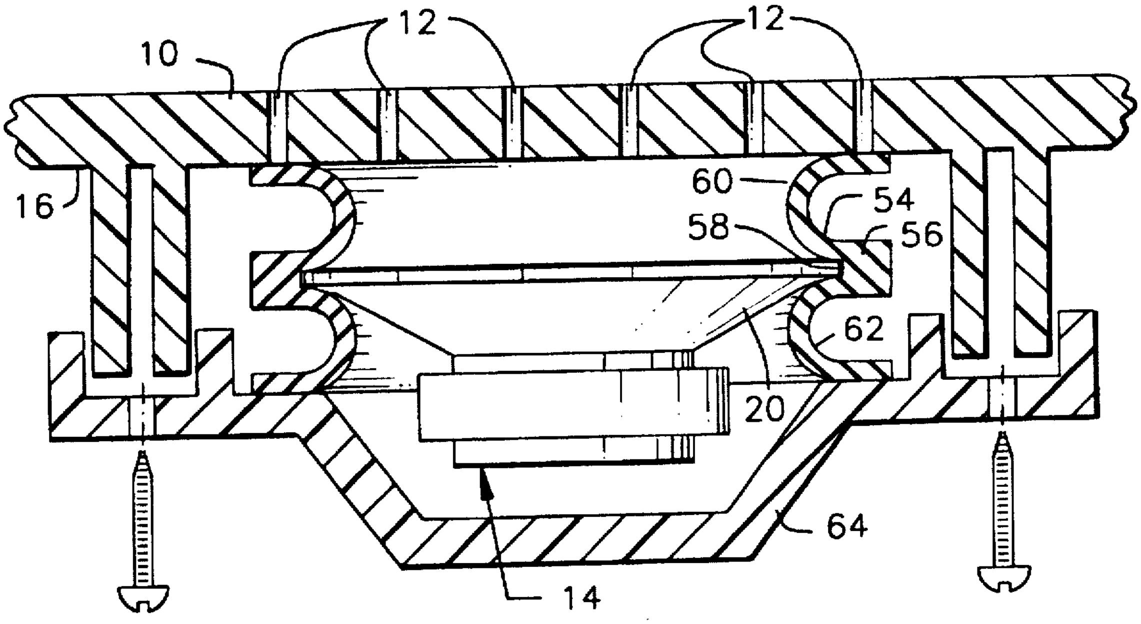
FIG. 7 illustrates a second embodiment of a mounting system constructed according to this invention.

FIG. 7 illustrates a second embodiment of the mounting system according to the present invention. In this embodiment, the mounting member 54 comprises a compliant gasket having a thickened central annular portion 56 with an interior groove 58 for holding the edge of the outer basket 20 of the speaker 14. A pair of annular, curved, beam-like extensions 60, 62 extend from opposite sides of the thickened portion 56. The enclosure 64 squeezes the extensions 60, 62 between the interior surface 16 and the enclosure 64 so that the speaker 14 is held by the gasket 54 without being rigidly mechanically coupled to the housing 10.

The gaskets 26, 54 also function to provide an acoustic seal around the edge of the speaker outer basket 20, such that the sound emanating from the front of the vibrating cone exits only through the openings 12. Also, since there is no direct clamping of the outer basket 20 to the interior surface 16, there is no mechanical distortion of the basket 20.

Accordingly, there has been disclosed a speaker mounting system wherein speaker vibrations are isolated from the surface to which the speaker is mounted. While illustrative embodiments of the present invention have been disclosed herein, it is understood that various modifications and adaptations to the disclosed embodiments will be apparent to those of ordinary skill in the art and it is intended that this invention be limited only by the scope of the appended claims.

What is claimed is:

1. A speaker mounting system for mounting a speaker to a support surface wherein the speaker includes a rigid outer basket which tapers inwardly from an open end toward a speaker magnet assembly and an inner vibratory cone coupled to the speaker magnet assembly, said outer basket having an edge surrounding said open end, the mounting system comprising:

a compliant mounting member secured to the outer basket at the open end of said outer basket, said mounting member having an elastic portion extending away from said outer basket open end; and holding means for clamping said mounting member to said support surface at a location on said elastic portion of said mounting member which is remote from said outer basket open end;

whereby said speaker is held only by said compliant mounting member and can move relative to said support surface as allowed by the elasticity of said elastic portion of said mounting member.

2. The mounting system according to claim 1 wherein:

said outer basket is frusto-conical in shape, tapering inwardly from said edge;

said compliant mounting member includes a compliant annular member surrounding the open end of said outer basket;

said compliant annular member has an annular interior groove adapted to surround and receive the edge of said outer basket; and said compliant annular member has a circumference which is sized relative to said outer basket edge so that said compliant annular member maintains said outer basket edge within said interior groove.

3. The mounting system according to claim 2 wherein:

said compliant annular member has a thickened annular portion;

said interior groove is in said thickened annular portion;

said elastic portion of said compliant mounting member includes an annular, curved, beam-like extension having a C-shaped cross-section and being secured at a first end of said extension to said thickened annular portion; and said holding means clamps the other end of said extension to said support surface.

4. The mounting system according to claim 3 wherein said holding means includes a rigid annular ring adapted to bear against said extension.

5. The mounting system according to claim 4 wherein said holding means further includes:

structure extending from said ring outwardly past said extension; and means for securing said structure to said support surface.

6. The mounting system according to claim 2 wherein:

said compliant annular member has a thickened central annular portion;

said interior groove is in said thickened central annular portion;

said elastic portion of said compliant mounting member includes a pair of annular beam-like extensions secured to respective opposed sides of said thickened portion, each of said extensions being curved into a C-shaped cross-section so that together with said thickened portion the cross-section of said compliant annular member is M-shaped; and said holding means bears against one of said extensions and the other of said extensions bears against said support surface.

7. The mounting system according to claim 6 wherein said holding means includes a rigid annular ring adapted to bear against said one extension.

8. The mounting system according to claim 7 wherein said holding means further includes:

structure extending from said ring outwardly past said pair of extensions; and means for securing said structure to said support surface.

9. A system for mounting a speaker to a support surface, wherein the speaker includes a speaker magnet assembly, an inner vibratory cone coupled to the speaker magnet assembly, and a rigid frusto-conical outer basket which tapers inwardly from an open end edge toward said speaker magnet assembly, the system comprising:

a compliant gasket having a cross-section configured as a curved beam and including at a first end of the beam a thickened portion having an annular interior groove adapted to surround and receive therein the open end edge of the rigid outer basket, the thickened portion having a circumference which is sized relative to the rigid outer basket open end edge so that the gasket maintains the rigid outer basket open end edge within the interior groove; and means for securing the other end of the beam to the support surface.

10. A speaker mounting system for mounting a speaker to a support surface wherein the speaker includes a rigid outer basket of frusto-conical shape which tapers inwardly from an open end toward a speaker magnet assembly, said outer basket having an edge surrounding said open end, the mounting system comprising:

a compliant mounting member secured to the outer basket at the open end of said outer basket and including a compliant annular member having a thickened annular portion with an interior groove surrounding the open end of said outer basket, said annular interior groove adapted to surround and receive the edge of said outer basket, said thickened annular portion having a circumference which is sized relative to said outer basket edge so that said compliant annular member maintains said outer basket edge within said interior groove, said compliant annular member further including an annular, curved, beam-like extension having a C-shaped cross-section secured to said thickened annular portion; and holding means for clamping said extension to said support surface.

11. The mounting system according to claim 10 wherein said holding means includes a rigid annular ring adapted to bear against said extension.

12. The mounting system according to claim 11 wherein said holding means further includes:

structure extending from said ring outwardly past said extension; and means for securing said structure to said support surface.

13. A speaker mounting system for mounting a speaker to a support surface wherein the speaker includes a rigid outer basket of frusto-conical shape which tapers inwardly from an open end toward a speaker magnet assembly, said outer basket having an edge surrounding said open end, the mounting system comprising:

a compliant mounting member secured to the outer basket at the open end of said outer basket and including a compliant annular member having a thickened central annular portion with an annular interior groove surrounding the open end of said outer basket, said annular interior groove adapted to surround and receive the edge of said outer basket, said thickened annular portion having a circumference which is sized relative to said outer basket edge so that said compliant annular member maintains said outer basket edge within said interior groove, said compliant annular member further including a pair of annular beam-like extensions secured to respective opposed sides of said thickened portion, each of said extensions being curved into a C-shaped cross-section so that together with said thickened portion the cross-section of said compliant annular member is M-shaped; and holding means for clamping said mounting member to said support surface, wherein said holding means bears against one of said extensions and the other of said extensions bears against said support surface.

14. The mounting system according to claim 13 wherein said holding means includes a rigid annular ring adapted to bear against said one extension.

15. The mounting system according to claim 14 wherein said holding means further includes:

structure extending from said ring outwardly past said pair of extensions; and means for securing said structure to said support surface.

* * * * *